United States Patent [19]

Lazzari et al.

[11] 3,940,688
[45] Feb. 24, 1976

[54] DEVICE FOR TESTING THE MAGNETIC PROPERTIES OF A MAGNETIC MATERIAL

[75] Inventors: Jean-Pierre Lazzari, Montfort L'Amaury; Jean-Yves Valet, Beauchamp, both of France

[73] Assignees: Commissariat a l'Energie Atomique, Paris; Compagnie Internationale pour l'Informatique, Les Clayes Sous Bois, both of France

[22] Filed: Sept. 30, 1974

[21] Appl. No.: 510,318

[52] U.S. Cl. .............................. 324/34 R
[51] Int. Cl.² ........................... G01R 33/12
[58] Field of Search ............ 324/34 R, 34 H, 34 PE

[56] References Cited
UNITED STATES PATENTS

| | | | |
|---|---|---|---|
| 1,196,223 | 8/1916 | Fahy | 324/34 R |
| 1,223,377 | 4/1917 | Fahy | 324/34 H |
| 2,137,177 | 11/1938 | Melchior | 324/34 R |
| 3,444,458 | 5/1969 | Scott | 324/34 R |

FOREIGN PATENTS OR APPLICATIONS

| | | | |
|---|---|---|---|
| 468,848 | 2/1952 | Italy | 324/40 |

OTHER PUBLICATIONS

Batcher, R.; Control Methods For Industrial Uses; Electronic Industries; Apr. 1944; pp. 94, 95, 198 & 200.

*Primary Examiner*—Robert J. Corcoran
*Attorney, Agent, or Firm*—Lane, Aitken, Dunner & Ziems

[57] ABSTRACT

A device for testing the magnetic properties of a magnetic material in which a measurement air gap and a measurement compensation air-gap, is established and a measuring coil is provided for collecting a voltage which is proportional to the variation of amplitude of the resultant useful flux derived from the magnetic material which is placed in the vicinity of the measurement air-gap.

7 Claims, 6 Drawing Figures

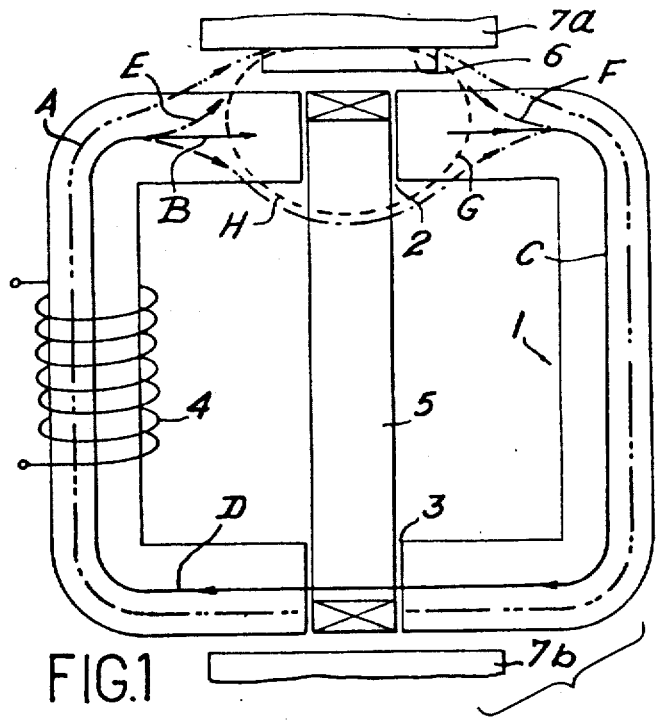
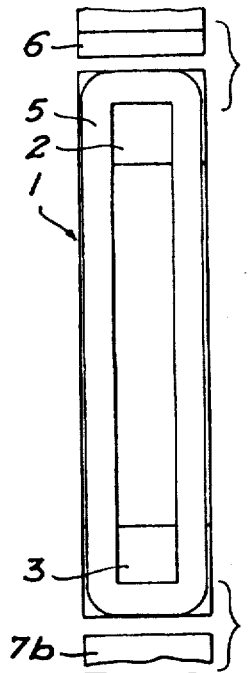
FIG.1  FIG.2
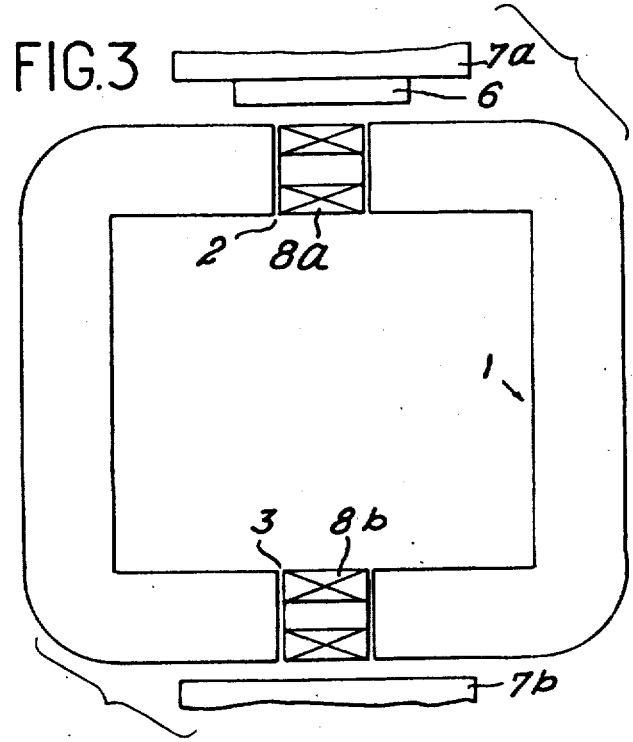
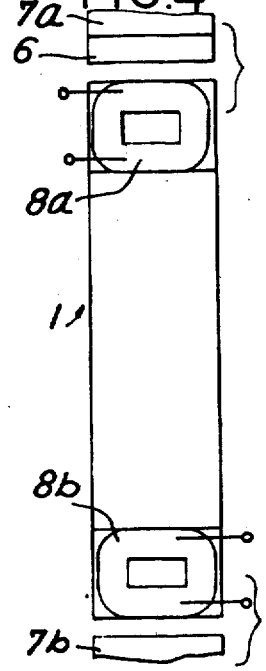
FIG.3  FIG.4

DEVICE FOR TESTING THE MAGNETIC PROPERTIES OF A MAGNETIC MATERIAL

This invention relates to a device for testing the magnetic properties of a magnetic material, such as a coercimeter, of a type comprising a magnetic circuit having two air-gaps and an alternating-current winding for producing the magnetic field of said circuit.

The majority of known magnetic coercimeters are of the volume type and usually entail the use of samples placed within the interior of the coercimeter.

In a first example of a volume coercimeter, the sample is placed within an exciting coil which also encloses the coil for collecting the useful signal and compensating for the signal which is directly induced by the excitation.

In a second example, the sample is placed within an exciting coil in the proximity of a Hall probe; this latter detects the difference between the excitation field and the demagnetizing field of the sample. When the magnetization of the sample is reversed, the demagnetizing field produced changes direction. The signal delivered by the probe then undergoes an abrupt jump: the field of the exciting solenoid is then equal to the coercive field of the material being tested.

These instruments perform non-localized overall measurements and if the dimensions of the sample to be tested are substantial, it is necessary either to construct a coercimeter having prohibitive dimensions or to make offcuts in the sample, with the result that this latter is destroyed.

The only known instrument for taking measurements of surface is the Kerr-effect coercimeter. The sample is subjected to a beam of polarized light and the orientation of the plane of polarization of the reflected beam is related to the direction of magnetization. A suitably placed analyzer extinguishes said beam in respect of a given direction of magnetization. THe signal derived from the detector exhibits an abrupt jump when the magnetization is reversed, that is to say when the excitation field exceeds the coercive field of the material being tested. The instruments which make use of the method just mentioned are highly sensitive to the state of surfaces.

THe primary aim of the invention is to circumvent the disadvantages attached to the known instruments mentioned in the foregoing and accordingly proposes a device for the surface testing of magnetic materials, said coercimeter being distinguished by the fact that it comprises a measurement air-gap and a measurement compensation air-gap, a measuring coil for collecting a voltage which is proportional to the variation of amplitude of the resultant useful flux derived from the magnetic material disposed in the vicinity of the measurement air-gap.

Measurement compensation, if necessary with respect to the support for the material, is carried out by means of a material which is identical with said support and placed in the vicinity of the compensation air-gap. This case arises for example when the support is conductive.

According to one aspect of the invention, the measuring coil is divided into two windings placed in one case within the measurement air-gap and in the other case within the measurement compensation air-gap so as to embrace the excitation fluxes of opposite direction and the useful flux, with the result that the fluxes of opposite direction are reduced to zero and that the useful flux alone remains within the measuring coil.

In order to obtain better collection of the useful flux, a single measuring coil can be placed within the measurement air-gap and within the measurement compensation air-gap.

According to another aspect of the invention, a magnetic bridge is placed parallel to the plane of the magnetic circuit in such a manner as to form an adjustment air-gap; the variations produced in this latter as a result of displacement of said bridge correct the defects of non-linearity and of dissymmetry of the magnetic circuit. The exciting coil is mounted on the magnetic bridge; the measuring coil is divided into two windings placed on each side of the magnetic bridge and connected so as to ensure that the excitation fluxes of opposite direction are reduced to zero and that the useful flux alone remains within the measuring coil.

According to a further aspect of the invention, the measuring coil is mounted on the magnetic bridge, the exciting coil is divided into two windings placed on each side of the magnetic bridge so as to ensure that the excitation fluxes of opposite direction and diverted into the magnetic bridge are reduced to zero and that the resultant useful flux alone remains within the measuring coil.

Examples of construction will now be described with reference to the accompanying drawings, in which:

FIG. 1 is a general diagram showing one form of construction of the device in accordance with the invention;

FIG. 2 is a diagrammatic sectional view of FIG. 1;

FIG. 3 is another example of construction of the device in accordance with the invention;

FIG. 4 is a diagrammatic sectional view of FIG. 3;

Figure 5:
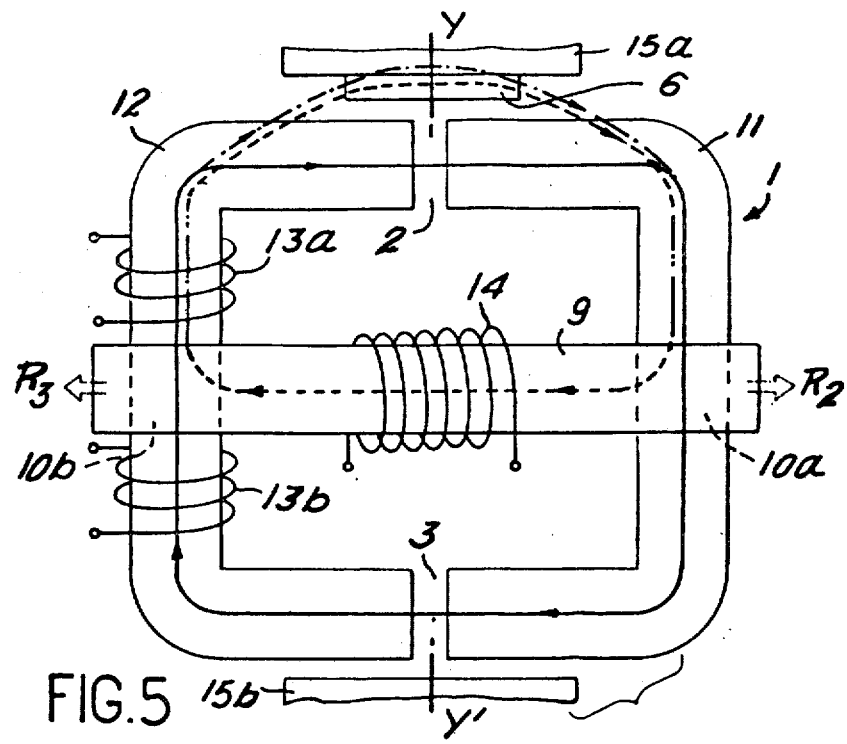
FIG. 5 is a further example of construction of the device in accordance with the invention.

As shown in FIGS. 1 and 2, a magnetic circuit 1 comprises a measuring air-gap 2 and a compensation air-gap 3. The magnetic circuit 1 is formed of material which is practically insensitive to eddy currents. A coil 4 is placed on the magnetic circuit 1. A measuring coil 5 is placed within the air-gaps 2 and 3.

Application of voltage to the exciting coil 4 produces an alternating magnetic field and this latter gives rise to an excitation flux having lines of force which follow the path A, B, C, D shown in full lines.

If a magnetic material 6 is moved towards the air-gap, said material is traversed by a leakage flux which is derived from the excitation flux.

The leakage flux is represented by the lines of force having the direction EF (chain-dotted line). At each alternation of the excitation flux, the magnetization within the material is reversed and produces a useful flux of opposite direction as represented by the lines of force having a direction GH (dashed line). A diverted useful flux also passes through the magnetic circuit in the direction CDAEF. The excitation flux thus passes through the air-gaps 2 and 3 with contrary signs, with the result that its action is cancelled whilst the useful flux retains the same sign and induces a voltage within the measuring coil 5. This voltage in fact represents the amplitude of the resultant useful flux and is proportional to the variation of amplitude between the positive and negative states of the useful flux, said variation being due to the coercive field defined by the characteristic hysteresis cycle of the material.

If the support 7a for the magnetic material 6 is conductive, currents induced by the excitation flux disturb the measurement. It is possible to eliminate this disturbance by placing opposite to the compensation air-gap 3 a conductive material 7b which is identical with the support.

In accordance with the invention, the single coil 5 of FIGS. 1 and 2 advantageously replaces the two windings 8a and 8b which are placed within the air-gaps 2 and 3 so as to obtain better collection of the resultant useful flux as shown in FIGS. 3 and 4. In this form of construction, the windings 8a and 8b are connected so as to collect the fluxes under the same directional conditions as those shown in FIG. 1.

Figure 6:
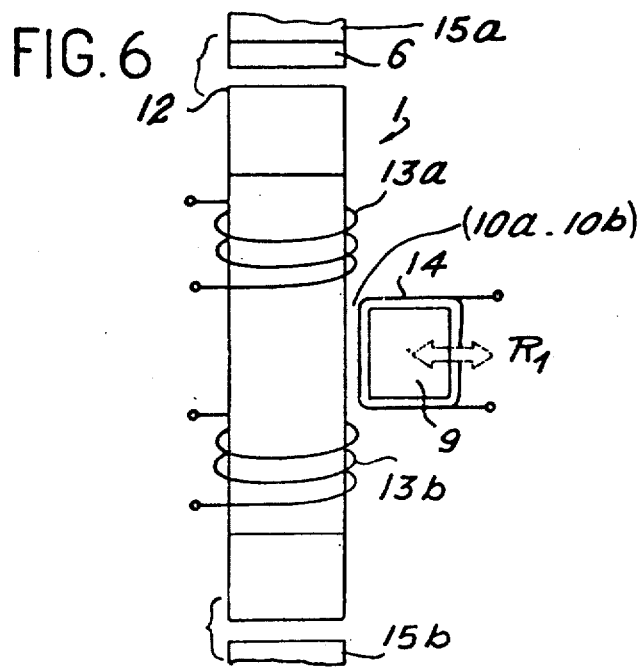
FIG. 6 is a side view of FIG. 5.

According to one aspect of the invention which is illustrated in FIGS. 5 and 6, a magnetic circuit 1 which is similar to that of FIG. 1 comprises a magnetic bridge 9 disposed parallel to the plane of the magnetic circuit. The bridge 9 is located at a certain distance from the plane of the magnetic circuit as shown in FIG. 6. THis distance produces an adjustment air-gap 10a or 10b with respect to each of the cores 11 and 12, the function of which will be explained in detail below. On the magnetic circuit 1, there is placed a coil unit formed of two windings 13a and 13b placed symmetrically on each side of the magnetic bridge 9 which also carries another coil 14. This arrangement makes it possible to reduce the measurement surface area of the material 6 by dispensing with the need for windings within the air-gap.

In accordance with the invention, the windings 13a, 13b can be employed for the excitation of the magnetic circuit 1 and the coil 14 can be reserved for the measuring operation (as shown in FIG. 5). The windings must be connected to each other in such a manner as to ensure that the excitation flux (full line) passes through the magnetic circuit as in the case of FIG. 1. The fluxes which are diverted (as shown in chain-dotted lines) from the excitation flux into the magnetic bridge 9 are of opposite direction and fall to zero. The useful flux (dashed line) obtained from the sample alone remains within the bridge 9 and is detected by the coil 14, the voltage delivered by said coil being proportional to the variation of the resultant useful flux. The compensation which is necessary for the presence of a conductive support 7a is carried out in the same manner as in the example of FIG. 1 by placing an identical material 7b close to the air-gap 3.

A preferred alternative embodiment of the invention permits the use of the coil 14 for the excitation of the magnetic circuit 1 and of the two windings 13a and 13b for the measurement. In this case, the windings must be connected to each other in such a manner as to ensure that the algebraic sum of the useful fluxes of opposite direction allow only the resultant useful flux to remain.

Without departing from the scope of the invention, the windings could be equally distributed (not shown) on the symmetrical cores 11 and 12. In the case of all the examples, electrical adjustment of the coercimeter is obtained by connecting the windings 13a and 13b across potentiometers (not illustrated) which limit the fluxes produced and/or collected to suitable values.

In the example of FIGS. 5 and 6, a functional magnetic adjustment of the coercimeter is obtained as a result of displacement of the magnetic bridge 9. By moving the bridge either towards or away from the magnetic circuit 1 (arrow $R_1$), the linearization of the $\beta$ (H) curve of the magnetic circuit 1 is accordingly corrected. By displacing the bridge in a direction parallel to itself with respect to the main circuit (arrows $R_2$, $R_3$), the dissymmetry of the cores 11 and 12 is accordingly corrected.

The device in accordance with the invention makes it possible to perform measurements of points in which the contact surface can have an area of less than 1 mm$^2$. It is not essential, however, to have a mechanical contact between the magnetic material to be tested and the measurement air-gap. Moreover, the device is insensitive to the state of surface of the material and to the nature of its support.

What we claim is:

1. A device for testing the magnetic properties of a test sample comprising a pair of U-shaped cores of magnetic material supported with their respective ends in an aligned and spaced relation to form a magnetic circuit, means for establishing an alternating flow of magnetic flux in said circuit, coil means extending through both of the gaps between the corresponding ends of said cores and arranged so that the magnetic flux passing through the coil means in one of said gaps cancels the effect of the magnetic flux passing through the coil means in the other gap, and means for supporting said test sample relative to said cores so that said test sample receives a portion of the flux passing through one of said gaps and establishes a circuit for said portion of said flux including the coil means in said latter gap to induce a voltage in said coil means and thus enable the magnetic properties of said test sample to be determined.

2. The device of claim 1 wherein said supporting means is of a conductive material and further comprising a member disposed relative to the other gap of a material having the same conductive properties as said supporting means.

3. The device of claim 1 wherein said coil means comprises a single coil extending through both of said gaps.

4. The device of claim 1 wherein said coil means comprises two coils respectively disposed in said gaps.

5. A device for testing the magnetic properties of a test sample comprising a pair of U-shaped cores of magnetic material supported with their respective ends in an aligned and spaced relation and forming a magnetic circuit, an additional core of magnetic material extending parallel to said U-shaped cores and movable in a direction parallel to as well as perpendicular to the plane of said cores to form an adjustable air gap with said cores to correct for non-linearities and dissymmetries in said magnetic circuit, said magnetic circuit and additional core forming a magnetic bridge circuit, means for establishing an alternating flow of magnetic flux in said magnetic bridge circuit, coil means for sensing the flux in said bridge circuit and arranged so that in the absence of a test sample the magnetic flux passing through one portion of said magnetic bridge circuit cancels the effect of the magnetic flux passing through the other portion of said magnetic bridge circuit, means for supporting said test sample relative to said U-shaped cores so that said test sample receives a portion of the flux passing through one of said gaps between the corresponding ends of said U-shaped cores and unbalances the flux in said bridge circuit, said coil means generating a voltage in response to said unbalanced flux from which the magnetic properties of said test sample may be determined.

6. The device of claim 5 wherein said magnetic flux flow establishing means comprises at least one coil extending about at least one of said U-shaped cores and connected to a source of alternating current and wherein said coil means is in the form of a coil extending about said additional core.

7. The device of claim 5 wherein said magnetic flux flow establishing means comprises a coil extending about said additional core and connected to a source of alternating current and wherein said coil means is in the form of at least one coil extending about one of said U-shaped cores.

* * * * *